United States Patent
Zaderej et al.

[11] Patent Number: 5,158,465
[45] Date of Patent: Oct. 27, 1992

[54] AUDIO JACK CONNECTOR

[75] Inventors: Victor V. Zaderej, North Haven; James E. Betters, Madison, both of Conn.

[73] Assignee: General Electric Company, Coshocton, Ohio

[21] Appl. No.: 484,229

[22] Filed: Feb. 23, 1990

[51] Int. Cl.⁵ .............................................. H01R 9/09
[52] U.S. Cl. ..................................... 439/55; 439/668; 439/931
[58] Field of Search ........................ 439/55, 78, 79, 83, 439/931, 886, 607, 610, 668, 592, 593; 29/848, 849; 361/413, 417

[56] References Cited

U.S. PATENT DOCUMENTS

| | | |
|---|---|---|
| 3,529,082 | 9/1970 | Hoesli . |
| 3,544,950 | 12/1970 | Lopez et al. ......................... 439/56 |
| 3,646,504 | 2/1972 | Classon . |
| 4,029,006 | 6/1977 | Mercer . |
| 4,120,330 | 10/1978 | Weismann . |
| 4,233,754 | 11/1980 | Dubuit . |
| 4,414,298 | 11/1983 | Krenz . |
| 4,584,767 | 4/1986 | Gregory ................................ 29/848 |
| 4,591,220 | 5/1986 | Impey ................................. 29/848 |
| 4,645,347 | 2/1987 | Rioux ................................ 356/376 |
| 4,668,033 | 5/1987 | Reichardt ............................ 439/83 |
| 4,689,103 | 8/1987 | Elarde ................................. 439/55 |
| 4,692,878 | 9/1987 | Ciongoli ............................ 364/518 |
| 4,710,419 | 12/1987 | Gregory ............................... 29/846 |
| 4,727,456 | 2/1988 | Metah et al. ........................ 361/417 |
| 4,749,355 | 6/1988 | Hemmer . |
| 4,764,849 | 8/1988 | Khan . |
| 4,791,490 | 12/1988 | Knight et al. . |
| 4,806,124 | 2/1989 | Bowlin ............................... 439/607 |
| 4,811,482 | 3/1989 | Moll .................................... 298/848 |
| 4,824,398 | 4/1989 | Taylor ................................ 439/557 |
| 4,894,018 | 1/1990 | Phillips et al. ....................... 439/81 |
| 4,921,453 | 5/1990 | O'Brien ........................... 439/931 X |

FOREIGN PATENT DOCUMENTS

| | | |
|---|---|---|
| 1162998 | 2/1984 | Canada . |
| 2019639 | 11/1971 | Fed. Rep. of Germany . |

OTHER PUBLICATIONS

IPC-MB-380 Draft Standard, Performance Specifications for Molded Printed Boards, Jan., 1987.

"Electrophoretic Photoresist Technology: An Image of the Future-Today", Vidusek, EPIC Winter Conference, Dec. 1988.

"Cast Spring"—A Plated, Molded Thermoplastic Electrical I/O Interface Jack O'Brien, Connection Technology, Jun. 1989.

MINT-PAC Technologies Inc., "Solutions to Tomorrows Electronic Packaging Needs", Summer 1989 promotional literature.

Primary Examiner—Larry I. Schwartz
Assistant Examiner—Khiem Nguyen
Attorney, Agent, or Firm—Gary L. Loser

[57] ABSTRACT

An electrical audio jack connector. An insulative substrate is provided in the shape of an audio jack connector. A shield plating is applied to the outer surface of the substrate. A passage through the substrate is plated to provide the signal conductor for the connector. A plurality of relief recesses are formed in the bottom of the connector to provide spring action to firmly grasp a male pin inserted into the connector.

21 Claims, 1 Drawing Sheet

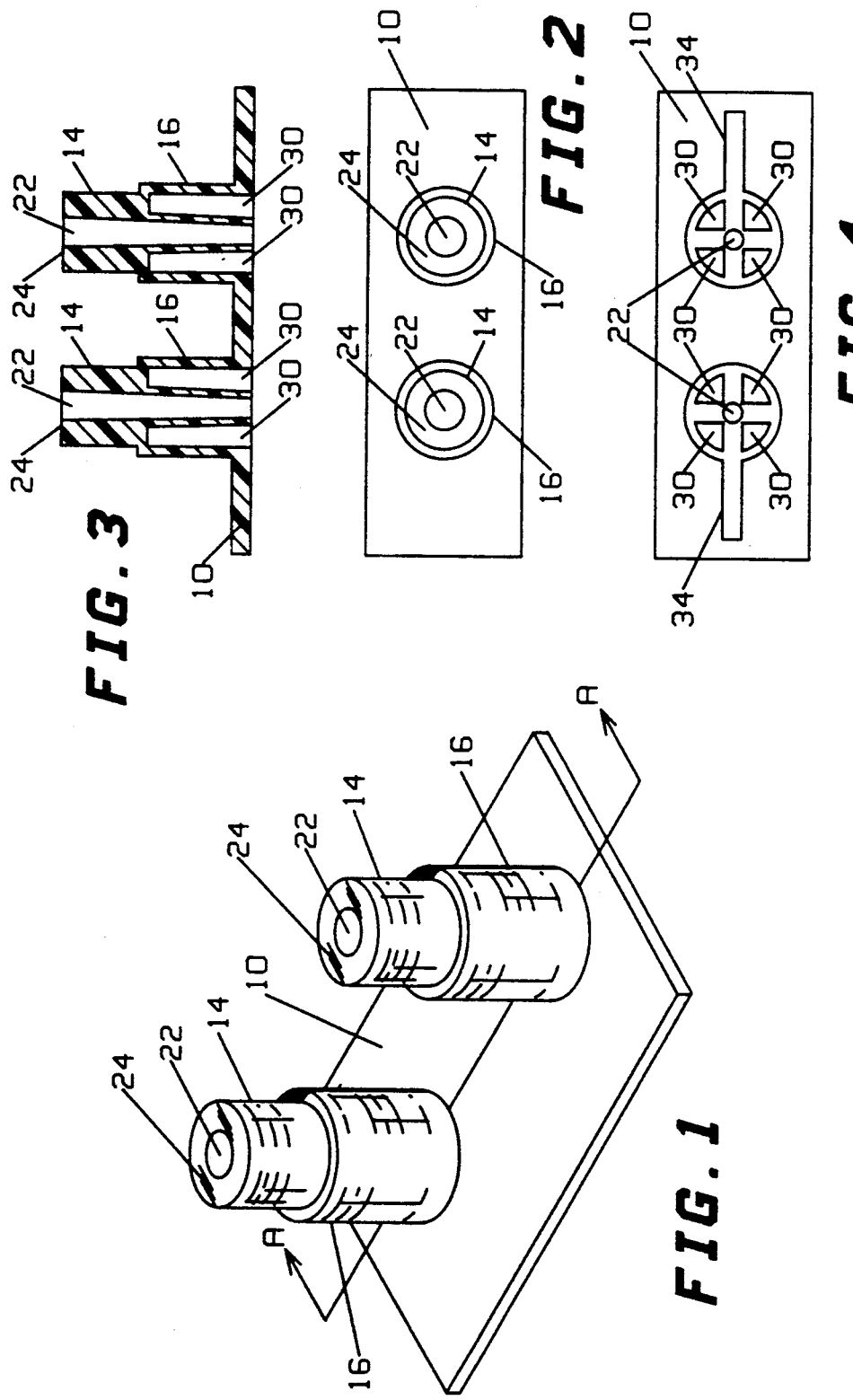

AUDIO JACK CONNECTOR

CROSS REFERENCE TO RELATED APPLICATIONS

This application is related to the following patent applications filed simultaneously herewith which are incorporated herein by reference: "Plated Electrical Connectors", to Victor Zaderej et al.; "Three Dimensional Plating Or Etching Process and Masks Therefor", to John Mettler et al.; "Plated D-Shell Connector", to Victor Zaderej et al.; and "Circuit Board Edge Connector", to Victor Zaderej et al.

BACKGROUND

1. Field of the Invention

This invention relates generally to the field of electrical connectors. More particularly, this invention relates to an electrical connector commonly used for audio and video applications which is commonly referred to as an audio jack connector, RCA connector or phono connector.

2. Background of the Invention

The term "audio jack connectors", "phono connectors", "RCA connectors" and the like are used synonymously herein. These terms are intended to generically embrace coaxial connectors which are commonly referred to by these names in the electronics industry as well as other coaxial connector devices which operate in a similar manner. These terms are not intended to restrict the usage of the connector to audio or phonograph applications since they are commonly used for other purposes including video, radio frequency (RF) and intermediate frequency (IF) applications.

Connectors such as those described above are commonly used for many electrical and electronic applications. These connectors are particularly popular in consumer electronics devices. As such, large quantities of these connectors are in use. In addition, there is a great deal of demand for such devices to be produced and installed in electronic systems at low cost to the manufacturer. Similar coaxial connection devices are also commonly used in radio frequency applications and the like which can benefit from decreased cost.

Traditionally, such connectors are installed manually by either soldering a pair of solder tabs to wires or cables which are connected to other electrical circuitry. Mechanical support is obtained by either a solder connection or by passing the connector through a hole in an electrical enclosure and securing the connector with a threaded nut and washer or similar connection procedures.

Obviously, such manufacturing techniques are labor intensive and result in higher product cost and lower reliability. It is thus desirable to provide a system for producing such connectors in a manner which is more conducive to automation in the manufacture of the end user product. In addition, existing connectors are made of several metal parts and insulators which are assembled together. It is also desirable to reduce the number of parts in the assembly to simplify the design and reduce or eliminate the possibility of assembly errors.

These and other drawbacks of the prior art connectors are ameliorated by the improved coaxial connector of the present invention.

SUMMARY OF THE INVENTION

It is an object of the present invention to provide an improved arrangement for providing a coaxial connector.

It is an object of the present invention to provide an improved audio jack connector.

It is another object of the present invention to provide an audio jack or similar connector which may be fabricated as a portion of a circuit board or plastic panel.

It is an advantage of the invention that the connector can be fabricated as a portion of the circuit board eliminating labor of later installation of a connector.

These and other objects and advantages of the invention will become apparent to those skilled in the art upon consideration of the following description of the invention.

In one embodiment of the present invention, an improved audio jack connector includes an electrically insulating substrate in the shape of a standard audio jack connector. The substrate has an upper surface, a lower surface, a passage extending from the upper surface to the lower surface which defines an inside passage surface, and an outer surface extending from. the upper surface to approximately the lower surface. An electrically conductive material is plated to the outer surface to form a shield conductor for the connector. An electrically conductive material is also plated to the inside passage to form a signal conductor for the connector.

An improved audio jack connector according to the present invention includes an electrically insulating substrate in the shape of a standard audio jack connector extending from and molded as an integral part of a printed wiring board. The substrate has an upper surface, a lower surface, a passage extending from the upper surface to the lower surface which defines an inside passage surface, and an outer surface extends from the upper surface to approximately the lower surface. An electrically conductive material is plated to the outer surface to form a shield conductor for the connector. An electrically conductive material is plated to the inside passage to form a signal conductor for the connector.

An improved audio jack connector includes an electrically insulating substrate in the shape of a stepped cylinder extending from and molded as an integral part of a printed wiring board. The substrate has an upper surface, a lower surface, a passage extending from the upper surface to the lower surface which defines an inside passage surface, and an outer surface extending from the upper surface to approximately the lower surface. The passage is tapered having a smaller diameter adjacent the lower surface than adjacent the upper surface. An electrically conductive material is plated to the outer surface to form a shield conductor for the connector. An electrically conductive material is also plated to the inside passage to form a signal conductor for the connector. An integral molded spring applies spring pressure inward toward a center of the passage, so that a solid electrical connection is provided between the plated passage and a male pin inserted into the passage, the springing means further comprising a plurality of relief recesses surrounding the inside surface passage.

In an electrical audio jack connector according to the present invention, an insulative substrate is provided in the shape of an audio jack connector. A shield plating is applied to the outer surface of the substrate A passage through the substrate is plated to provide the signal conductor for the connector. A plurality of relief recesses are formed in the bottom of the connector to provide spring action to firmly grasp a male pin inserted into the connector.

A spring contact for a molded connector according to the present invention includes an electrically insulative substrate. A passage having a wall is formed within the substrate for accepting a male connector member. The passage is dimensioned so that the male member is subjected to a compressive force from the wall of the passage when inserted within the passage. A relief channel is fabricated adjacent the passage, for reducing the amount of compressive force applied to the male connector member by effectively reducing the thickness of the wall.

The present invention provides an improved audio jack connector or similar coaxial connector which may be molded as a part of an electronic circuit board with electrical contacts formed by plated metal.

A molded and plated coaxial connector according to the present invention includes an approximately cylindrical insulative substrate having a passage through a central axis thereof, the substrate also includes an outer surface and a passage surface. A shield is plated to the outer surface, to provide a shield conductor for the connector. A conductor is plated to the passage surface, to provide a signal conductor for the connector.

The features of the invention believed to be novel are set forth with particularity in the appended claims. The invention itself, however, both as to organization and method of operation, together with further objects and advantages thereof, may be best understood by reference to the following description taken in conjunction with the accompanying drawing.

BRIEF DESCRIPTION OF THE DRAWING

FIG. 1 shows a perspective view of a circuit board including the connectors of the present invention.

FIG. 2 shows cross-sectional view at section A—A of FIG. 1 of the connectors of the present invention.

FIG. 3 is a top view of the connectors of the present invention.

FIG. 4 is a bottom view of the connector of the present invention.

DETAILED DESCRIPTION OF THE INVENTION

Turning now to the drawing in which like reference numerals designate corresponding parts throughout the several figures thereof, and in particular to FIG. 1, a coaxial audio jack connector according to the present invention is shown. In the illustrations, a pair of such jacks are shown since for stereo or input/output applications such jacks are typically used in pairs. Of course, this is not to be limiting since one such jack or an array of many such jacks may also be used. Like reference numerals are used for both connectors of the pair.

The preferred connector as shown is molded in the shape of two end to end cylinder sections extending upward from a planar circuit board 10. This is, of course, one of several standard shapes used in the industry for such electrical connectors. Other standard shapes are also suitable. The change in diameter due to the arrangement of the cylinder sections enable the mating male plug (not shown) to firmly engage the jack while easily sliding on and off. In alternative embodiments, a single cylinder or tapered conic section or stacked conic sections may be substituted for the stepped cylinder shape shown.

The top cylinder section 14 has a diameter of approximately 0.33 inches (plus 0.000 or minus 0.002) in the preferred embodiment and the bottom cylinder 16 has a diameter of approximately 0.40 inches (plus or minus 0.005 inches). While these dimensions, as well as other dimensions disclosed herein, are not intended to be limiting, they provide for a good mate with commercially available audio plugs. The dimensions disclosed are for the unplated plastic part and assume that a conductive plating thickness of approximately 0.0015 inches will be deposited on the part.

A tapered passage 22 having diameter of approximately 0.1350 inches at the top, passes from top surface 24 to the bottom of the circuit board to a diameter of approximately 0.125 inches at the bottom. The outer surfaces of the stacked cylinders 14 and 16 are plated with a conductive metal using the process described in the John Mettler et al. patent application referenced above and incorporated by reference herein. Preferrably, nickel is used to plate this outer surface to provide a durable surface which is resistant to abrasion. Other suitable processes may also be used to produce the metalization patterns described herein. This conductive plating traditionally is connected to electrical ground and may be so connected by appropriate metal patterns formed on the upper surface of the circuit board 10 if required. In one embodiment, the entire planar surface of the circuit board 10 may be plated with a conductor to effect both a ground connection for the outer surface and to provide shielding.

The top surface 24 is unplated (or has the plating etched or ground away). The inner surface of passage 22 is similarly plated with a conductive metal to form a connection which mates with a male connector mated with the jack of the present invention. This inner passage is tapered to gradually provide loading to the plastic spring when a male pin member is inserted as will be described.

FIG. 2 is a top view of the connector of FIG. 1 showing the stepped diameter of the two cylinders. Area 24 is the unplated area which insulates the shielded outside of the connectors with the conductive material of the passage 22.

Turning now to FIG. 3, a sectional view of the connectors of FIG. 1 is shown. The cross-sectional shape shown in this figure of each connector is identical to that which would be seen if a section of the connector were taken at a 90 degree angle from the current section. The inside of each connector includes four relief recesses 30 (two seen in each connector) which may be plated and in electrical contact with the plating on the inside of passage 22. These recesses 30 permit the material forming tapered passage 22 to flex somewhat to permit tight electrical connection with the pin of a male audio plug inserted in the passage while reducing the amount of spring pressure.

The top of passage 22 is approximately 0.135 inches in diameter (plus or minus about 0.008 inches) and the bottom of the passage 22 is approximately 0.126 inches in diameter (plus 0.000 or minus 0.002 inches). These dimensions provide approximately 150 to 500 grams of normal force when the connectors are engaged. Displacement of the plastic springs is limited to a range which prevents significant stress on the plastic. This range of force, of course, may be varied by changes in material or changes in dimension or tolerance.

Turning now to FIG. 4, a typical plating configuration for the lower surface of the circuit board 3 is shown. Other circuitry such as surface mount components and the like are not shown, nor are circuit board traces for such components. The bottom of the connector in areas where the recesses 30 do not appear form an X-shape with an opening in the center corresponding to the passage 22. The periphery of the recesses 30 are similarly plated in a circular pattern to connect all of the four arms forming the X-shape to assure that connection to the male pin inserted in the passage 22 is coupled to an appropriate trace 34 for connection to other circuitry.

While four segments which define the central passage are shown, more or fewer could be used with satisfactory results. These segments with relief recesses 30 provide a spring function due to the resilience of the material used to mold them. In the preferred embodiment, the material used to mold the connector is General Electric Ultem 2312 Polyetherimide, but other materials may also be suitable.

The relief recesses 30 in cooperation with the tapered passage 22 form a spring contact for this or other molded connectors according to the present invention includes an electrically insulative substrate. The passage 22 is dimensioned so that the male member is subjected to a compressive force from the wall of the passage when inserted within the passage. Relief channel or recess 30 is fabricated adjacent the passage, for reducing the amount of compressive force applied to the male connector member by effectively reducing the thickness of the wall.

Thus it is apparent that in accordance with the present invention, an improved apparatus and method that fully satisfies the objectives, aims and advantages is set forth above. While the invention has been described in conjunction with specific embodiments, it is evident that many alternatives, variations, modifications and permutations will become apparent to those skilled in the art in light of the foregoing description. Accordingly, it is intended that the present invention embrace all such alternatives, variations, modifications and permutations as fall within the spirit and broad scope of the appended claims.

What is claimed as new and desired to be secured by Letters Patent is:

1. An improved audio jack connector, consisting essentially of:
    an electrically insulating substrate in the shape of a standard audio jack connector said audio jack connector extending from and molded as an integral part of a planar substrate;
    said substrate having an upper surface, a lower surface, a passage extending from said upper surface to said lower surface which defines an inside passage surface, and an outer surface extending from said upper surface to approximately said lower surface;
    an electrically conductive material plated to said outer surface to form a shield conductor for said connector; and
    an electrically conductive material plated to said inside passage to form a signal conductor for said connector.

2. The apparatus of claim 1, further consisting essentially of an integral molded springing means for applying spring pressure inward toward a center of said passage, so that a solid electrical connection is provided between said plated passage and a male pin inserted into said passage.

3. The apparatus of claim 2, wherein said springing means further consisting essentially of at least one relief recess adjacent said inside surface passage.

4. The apparatus of claim 2, wherein said springing means further consisting essentially of a plurality of relief recesses surrounding said inside surface passage.

5. The apparatus of claim 1, wherein said substrate is molded into the shape of a stepped cylinder.

6. The apparatus of claim 1, wherein said passage comprises a tapered passage having a smaller diameter adjacent said lower surface than adjacent said upper surface.

7. The apparatus of claim 1, wherein said substrate is molded as an integral part of a printed wiring board.

8. An improved audio jack connector, consisting essentially of:
    an electrically insulating substrate in the shape of a standard audio jack connector extending from and molded as an integral part of a printed wiring board;
    said substrate having an upper surface, a lower surface, a passage extending from said upper surface to said lower surface which defines an inside passage surface, and an outer surface extending from said upper surface to approximately said lower surface;
    an electrically conductive material plated to said outer surface to form a shield conductor for said connector; and
    an electrically conductive material plated to said inside passage to form a signal conductor for said connector.

9. The apparatus of claim 8, further consisting essentially of an integral molded springing means for applying spring pressure inward toward a center of said passage, so that a solid electrical connection is provided between said plated passage and a male pin inserted into said passage.

10. The apparatus of claim 9, wherein said springing means further consisting essentially of relief recess means adjacent said inside surface passage.

11. The apparatus of claim 9, wherein said relief recess means consisting essentially of a plurality of relief recesses surrounding said inside surface passage.

12. The apparatus of claim 8, wherein said substrate is molded into the shape of a stepped cylinder.

13. The apparatus of claim 8, wherein said passage comprises a tapered passage having a smaller diameter adjacent said lower surface than adjacent said upper surface.

14. An improved jack connector, consisting essentially of:
    insulative audio jack connector substrate means having a shape of a standard audio jack connector with a passage therethrough;
    printed wiring board means molded as an integral part of said substrate means, for carrying and interconnecting electrical components;
    shield plating means, deposited on the surface of said substrate means, for forming a shield conductor for said connector; and
    signal plating means, deposited on walls defining said passage, for forming a signal conductor for said connector.

15. The apparatus of claim 14, further consisting essentially of springing means molded as an integral part of said substrate means, for providing spring pressure to the walls of said passage.

16. An improved audio jack connector, consisting essentially of:
- an electrically insulating substrate in the shape of a stepped cylinder extending from and molded as an integral part of a printed wiring board;
- said substrate having an upper surface, a lower surface, a passage extending from said upper surface to said lower surface which defines an inside passage surface, and an outer surface extending from said upper surface to approximately said lower surface;
- said passage comprises a tapered passage having a smaller diameter adjacent said lower surface than adjacent said upper surface;
- an electrically conductive material plated to said inside passage to form a signal conductor for said connector;
- integral molded springing means for applying spring pressure inward toward a center of said passage, so that a solid electrical connection is provided between said plated passage and a male pin inserted into said passage, said springing means further comprising at least one relief recess adjacent said inside surface passage.

17. A molded and plated coaxial connector, consisting essentially of:
- an approximately cylindrical insulative substrate having a passage through a central axis thereof, said substrate also including an outer surface and a passage surface, said coaxial connector extending from and molded as an integral part of a planar substrate;
- shielding means, plated to said outer surface, to provide a shield conductor for said connector; and
- conducting means, plated to said passage surface, to provide a signal conductor for said connector.

18. The apparatus of claim 17, further consisting essentially of an integral molded springing means for applying spring pressure inward toward a center of said passage, so that a solid electrical connection is provided between said plated passage and a male pin inserted into said passage.

19. The apparatus of claim 18, wherein said springing means further consists essentially of at least one relief recess adjacent said inside surface passage.

20. The apparatus of claim 19, wherein said springing means further consists essentially of a plurality of relief recesses surrounding said inside surface passage.

21. A spring contact for a molded connector, consisting essentially of:
- an electrically insulative substrate, said connector extending from and molded as an integral part of a planar substrate;
- a passage having a wall including conductive material, within said substrate for accepting a male connector member, said passage being dimensioned so that said male member is subjected to a compressive force from the wall of said passage when inserted within said passage; and
- relief channel means adjacent said passage, for reducing the amount of compressive force applied to said male connector member by effectively reducing the thickness of said wall.

* * * * *